(12) United States Patent  
Taylor

(10) Patent No.: US 9,294,095 B2  
(45) Date of Patent: Mar. 22, 2016

(54) APPARATUSES AND METHODS FOR INPUT BUFFER HAVING COMBINED OUTPUT

(71) Applicant: Micron Technology, Inc., Boise, ID (US)

(72) Inventor: Jennifer Taylor, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 50 days.

(21) Appl. No.: 14/031,545

(22) Filed: Sep. 19, 2013

(65) Prior Publication Data

US 2015/0077182 A1    Mar. 19, 2015

(51) Int. Cl.  
    *H03F 3/45*     (2006.01)  
    *H03K 19/0185*     (2006.01)  
    *H03K 19/0175*     (2006.01)

(52) U.S. Cl.  
CPC ............. *H03K 19/018528* (2013.01); *H03K 19/017509* (2013.01)

(58) Field of Classification Search  
None  
See application file for complete search history.

(56) References Cited

U.S. PATENT DOCUMENTS

| | | | | |
|---|---|---|---|---|
| 4,253,033 A * | 2/1981 | Redfern | ........................ | 326/110 |
| 4,958,133 A * | 9/1990 | Bazes | ........................ | 330/253 |
| 5,491,441 A * | 2/1996 | Goetschel | ............... | H03K 5/026 326/21 |
| 5,864,254 A * | 1/1999 | Tashiro | ............... | H03F 3/45183 327/319 |
| 6,825,692 B1 * | 11/2004 | Chung | ........... | H03K 19/018585 326/68 |
| 7,622,986 B2 * | 11/2009 | Pan | ...................... | G11C 7/1078 327/52 |
| 7,808,275 B1 * | 10/2010 | Ansel et al. | ..................... | 326/82 |
| 7,924,067 B2 * | 4/2011 | Cowles | .......... | H03K 19/018528 327/108 |
| 8,330,501 B1 * | 12/2012 | Santurkar et al. | ............... | 327/70 |
| 8,823,454 B2 * | 9/2014 | Sanchez | ........................ | 330/261 |
| 8,929,163 B2 * | 1/2015 | Taylor | ................. | H03F 3/45179 365/189.16 |
| 2014/0269118 A1 * | 9/2014 | Taylor et al. | .................. | 365/193 |

* cited by examiner

*Primary Examiner* — Alexander H Taningco  
*Assistant Examiner* — Nelson Correa  
(74) *Attorney, Agent, or Firm* — Schwegman Lundberg & Woessner, P.A.

(57) ABSTRACT

Apparatuses and methods are disclosed, including an apparatus that includes a first differential amplifier to amplify a difference between an input signal and a reference signal, and a second differential amplifier to amplify the difference between the input signal and the reference signal. The apparatus may further include an inverter circuit to receive an output signal of the first differential amplifier and another inverter circuit to receive an output signal of the second differential amplifier. The apparatus may include an output circuit to combine the outputs of the inverter circuits. The inverter circuits may each include an inverter and a shunt resistance. Additional apparatuses and methods are described.

21 Claims, 5 Drawing Sheets

APPARATUSES AND METHODS FOR INPUT BUFFER HAVING COMBINED OUTPUT

BACKGROUND

Some integrated circuit (IC) devices have input buffers to convert analog data input signals into full-rail complementary metal-oxide-semiconductor (CMOS) signals. For single-ended input signals, the transition from a logic 'high' to a logic 'low' is dependent on when the input signal crosses a reference voltage. A differential amplifier may detect such a transition.

A metal-oxide-semiconductor (MOS)-based self-biased differential amplifier can convert input signal swings to full-rail signals. However, as the supply voltage becomes very low, there may not be enough voltage margin to keep the input buffer components within a specified operating region. Some other input buffers that can operate at lower supply voltages may not be able to operate over a wide common mode input range.

BRIEF DESCRIPTION OF THE DRAWINGS

Some embodiments are illustrated by way of example and not limitation in the figures of the accompanying drawings in which.

DETAILED DESCRIPTION

For the purposes of this document, an "apparatus" can refer to any of a number of structures, such as circuitry, a device, or a system. Potentials refer to electrical potentials.

Input buffer circuits may output a signal, for example a square wave, indicating when an input voltage crosses a reference voltage. In some applications, the reference voltage may be halfway between a supply voltage (Vcc). In some other applications the reference voltage may be near ground (e.g., ≤10% of Vcc) or near Vcc (e.g., ≥90% of Vcc). Some present input buffer systems may not operate well over a wide input common mode range. Other input buffer systems, even if they do operate over a wide input common mode range, may not maintain circuit elements in their intended operating regions at a low Vcc.

Figure 1:
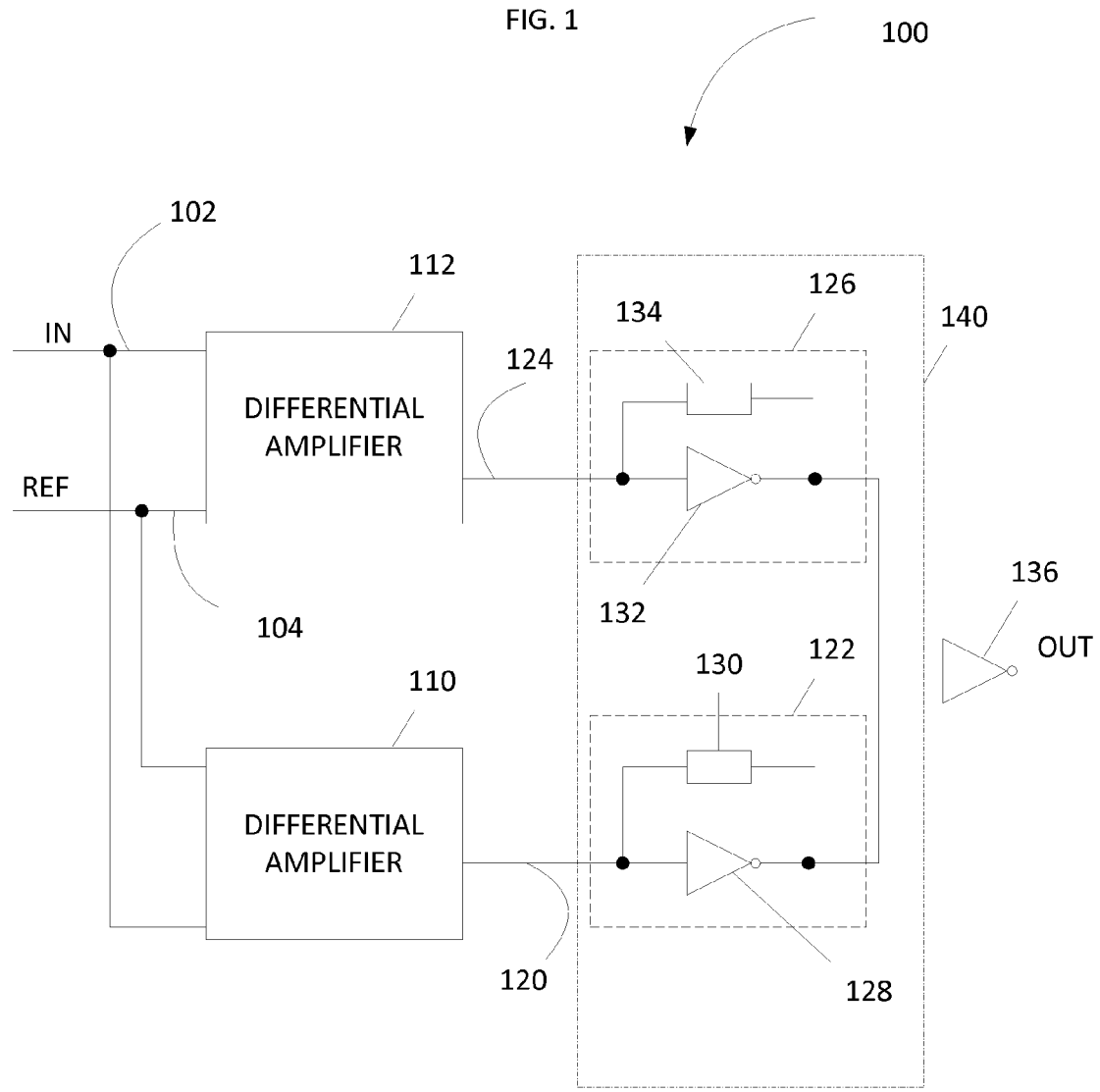
FIG. 1 is a block diagram of an apparatus in the form of an input buffer system according to various embodiments.

An apparatus shown in FIG. 1 can address both the challenges of low Vcc and wide input common mode range noted above, as well as other challenges. FIG. 1 is a block diagram of an apparatus in the form of an input buffer system 100 according to various embodiments.

The input buffer system 100 may receive an input signal IN at an input terminal 102 coupled to an input of a first circuit 110. The input terminal 102 may further couple to a second circuit 112, which can be arranged in parallel with the first circuit 110. The input buffer system 100 may receive a reference signal REF at an input terminal 104 coupled to second inputs of the first circuit 110 and the second circuit 112. The first circuit 110 may include a p-type differential amplifier and the second circuit 112 may include an n-type differential amplifier. The p-type differential amplifier, the n-type differential amplifier, or both the p-type differential amplifier and the n-type differential amplifier can be at least partially self-biased. Alternatively, the p-type differential amplifier, the n-type differential amplifier, or both the p-type differential amplifier and the n-type differential amplifier can be externally biased.

The first circuit 110 amplifies the input signal IN to generate a first output signal on a first output 120 that couples to a first inverter circuit 122. The second circuit 112 amplifies the input signal IN to generate a second output signal on a second output 124 coupled to a second inverter circuit 126. The outputs 120 and 124, respectively, of the circuits 110 and 112 may have variable gains depending on the input common mode. For example, at low common mode input, the differential amplifier of the first circuit 110 (e.g., a p-type differential amplifier), may produce a wide swing output. Conversely, at a high common mode input, the differential amplifier of the second circuit 112 (e.g., an n-type differential amplifier), may produce a wide swing output. The input buffer system 100 maintains the outputs 120 and 124 separately and feeds the signals at the outputs 120 and 124 through a shunt feedback network comprising two parallel inverter circuits 122 and 126 to maintain more gain in the input buffer system 100 to achieve rail-to-rail outputs at faster clock speeds.

The shunt feedback network 140 may adjust the output common mode and output swing to result in improved high-speed performance and wider common mode input range, compared with some present input buffer circuits that short the outputs 120 and 124 together, due to additional inverter stage gain and multiple feedback resistance paths. The first inverter circuit 122 may comprise an inverter 128 and a shunt resistance 130. The second inverter circuit 126 may comprise an inverter 132 and a shunt resistance 134. By varying the resistance within the shunt feedback network, the output common mode and output swing may be varied to achieve improved duty cycle performance at fast input tCKs. For example, a higher shunt feedback resistance may allow a larger output swing, but a higher shunt feedback resistance may result in increased levels of duty cycle distortion at a fast tCK with varying input conditions.

The shunt resistance 130 may have a resistance value between 1Ω and 50 kΩ. The shunt resistance 130 may comprise, for example, a transistor arranged in a resistor-like configuration, or the shunt resistance 130 may comprise a resistor. The shunt resistance 134 may have a resistance value between 1Ω and 50 kΩ. The shunt resistance 134 may comprise, for example, a transistor arranged in a resistor-like configuration, or the shunt resistance 130 may comprise a resistor. An output of the first inverter circuit 122 and an output of the second inverter circuit 126 may couple to an output circuit 136. The output circuit 136 may comprise an inverter to invert the output of the first inverter circuit 122 and the output of the second inverter circuit 126 to generate an output signal OUT.

While the input buffer system 100 of some example embodiments may consume more power and use more circuit layout space than some present input buffer circuits, the input buffer system 100 of some embodiments may accommodate different operational parameters of newer or different systems by maintaining circuit elements in their operating regions at lower Vcc compared with some present input buffer circuits. The input buffer system 100 may also operate at higher clock speeds (tCK) with reduced or no duty cycle distortion compared with some other input buffer circuits.

Figure 2:
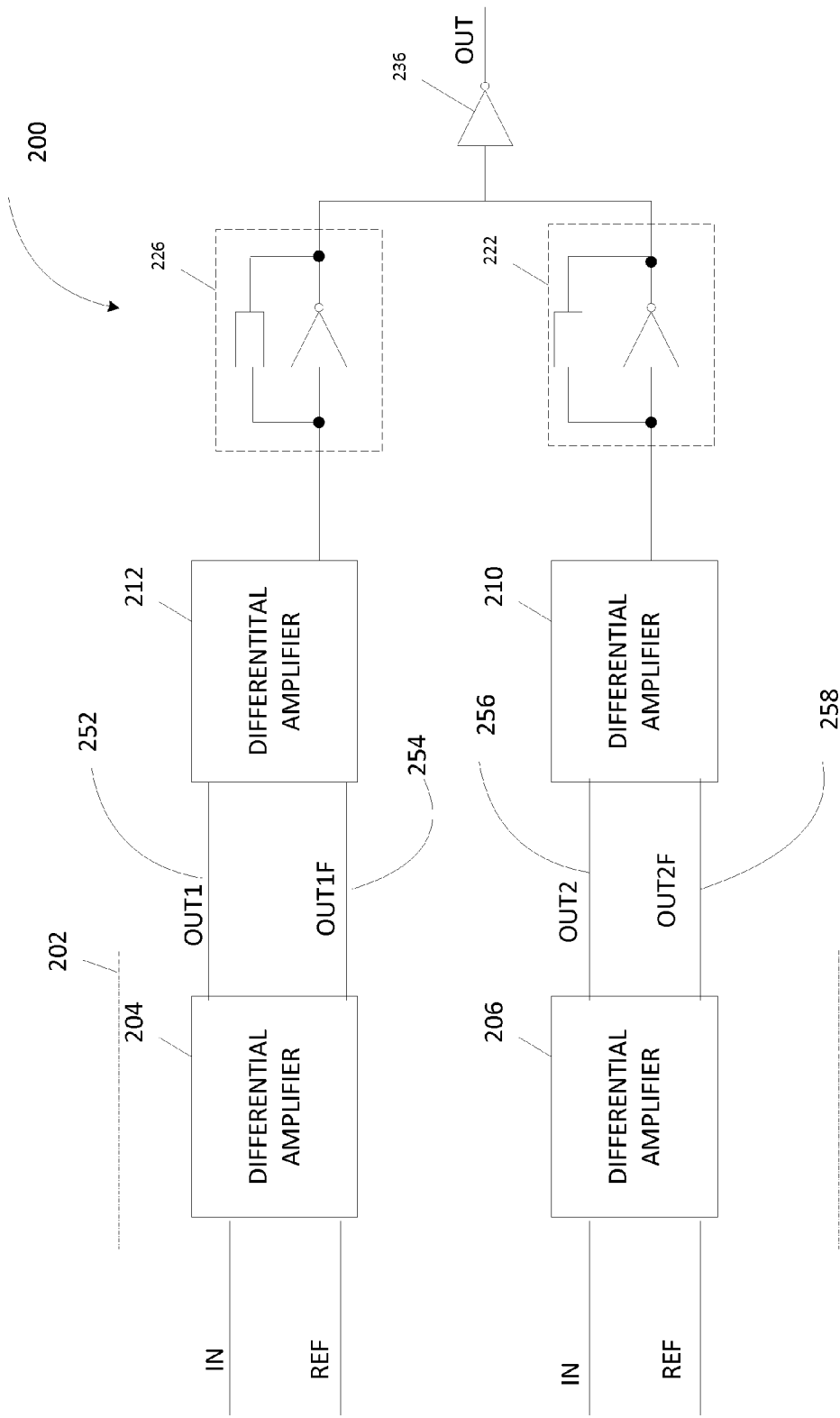
FIG. 2 is a block diagram of an apparatus in the form of a mixed-mode receiver according to various embodiments.

FIG. 2 is a block diagram of an apparatus in the form of a mixed-mode receiver 200 in accordance with some embodiments. In at least these embodiments, the input buffer system 100 (FIG. 1) may be used as part of the mixed-mode receiver 200.

A mixed-mode receiver 200 may include a Current-Mode Logic (CML) input buffer 202. The CML input buffer 202 may include a differential amplifier 204 to amplify a difference between an input signal IN and a reference signal REF. The differential amplifier 204 may include an n-type differential amplifier. Another differential amplifier 212 may receive outputs 252, 254 of the differential amplifier 204. The differential amplifier 212 may include an n-type differential amplifier. The differential amplifier 212 may be operable to serve as the second circuit 112 (FIG. 1). The differential amplifier 212 may be externally biased. Alternatively, the differential amplifier 212 may be at least partially self-biased. Similarly to the inverter 126 described above, an inverter circuit 226 may receive an output signal of the differential amplifier 212.

The CML input buffer 202 may include a differential amplifier 206, which can be arranged in parallel with the differential amplifier 204, to amplify the difference between the input signal IN and the reference signal REF. The differential amplifier 206 may include a p-type differential amplifier. Another differential amplifier 210 may receive outputs 256, 258 of the differential amplifier 206. The differential amplifier 210 may include a p-type differential amplifier. The differential amplifier 210 may be operable to serve as the first circuit 110 (FIG. 1). The differential amplifier 210 may be at externally biased. Alternatively, the differential amplifier 210 may be at least partially self-biased. Similarly to the inverter circuit 122 described above, an inverter circuit 222 may receive an output signal of the p-type differential amplifier 210. The mixed-mode receiver 200 may further include an output circuit 236 to combine the outputs of the inverter circuits 226 and 222.

One or both of the inverter circuits 222 and 226 may comprise inverters or shunt resistances similar to the inverter circuits 122 and 126 as described above with respect to FIG. 1. The differential amplifiers 210 and 212 may convert the CML mode level to a full-rail swing. The mixed-mode receiver 200 may further include a switch 306 (FIG. 3) to disconnect an output of one of the inverter circuits 222 and 226 from the input of the inverter 236.

Figure 3:
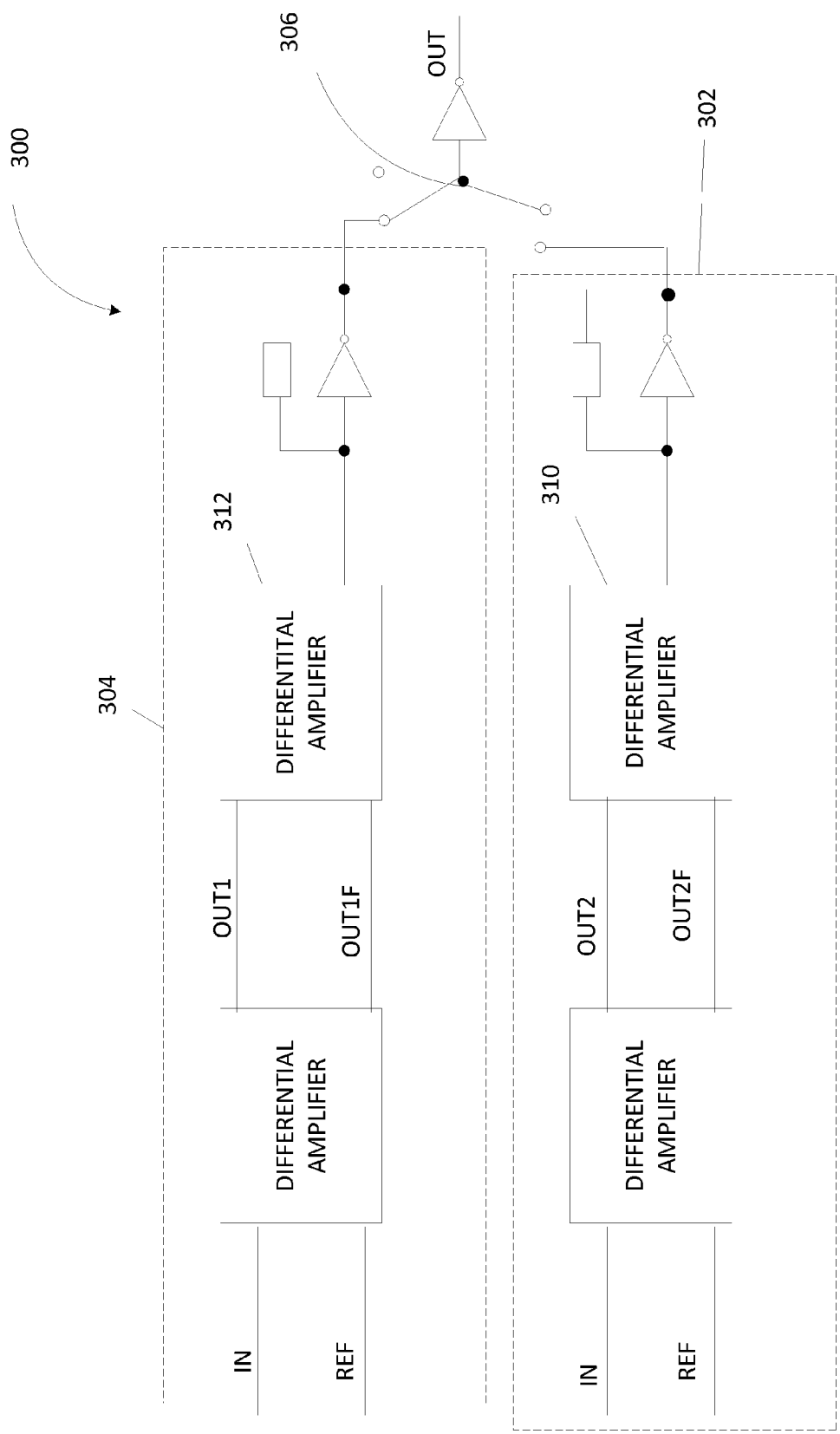
FIG. 3 is a block diagram of an apparatus in the form of a switched mixed-mode receiver according to various embodiments.

FIG. 3 is a block diagram of an apparatus in the form of a switched-path mixed-mode receiver 300 in accordance with some embodiments. The switched-path mixed-mode receiver 300 may include a first path 302 comprising a first circuit 310. The first circuit 310 may be operable to serve as the first circuit 110 (FIG. 1). For example, the first circuit 310 may comprise a p-type differential amplifier. The switched-path mixed-mode receiver 300 may further include a second path 304 comprising a second circuit 312. The second circuit 312 may be operable to serve as the second circuit 312 (FIG. 1). For example, the second circuit 312 may comprise an n-type differential amplifier.

In at least some embodiments, a path 302 through the first circuit 310 may be disconnected or disabled using the switch 306 to save the bias current in the path 302. Alternatively, a path 304 through the second circuit 312 may be disconnected or disabled to save the bias current in the path 304. For example, in the case of a high input common mode application, path 302 may be disconnected. In the case of a low common mode input, path 304 may be disconnected. A path 302 or 306 may be disabled based on customer or device needs. The switch 306 may include a metal switch, a MOS switch, or other type of switch.

Figure 4:
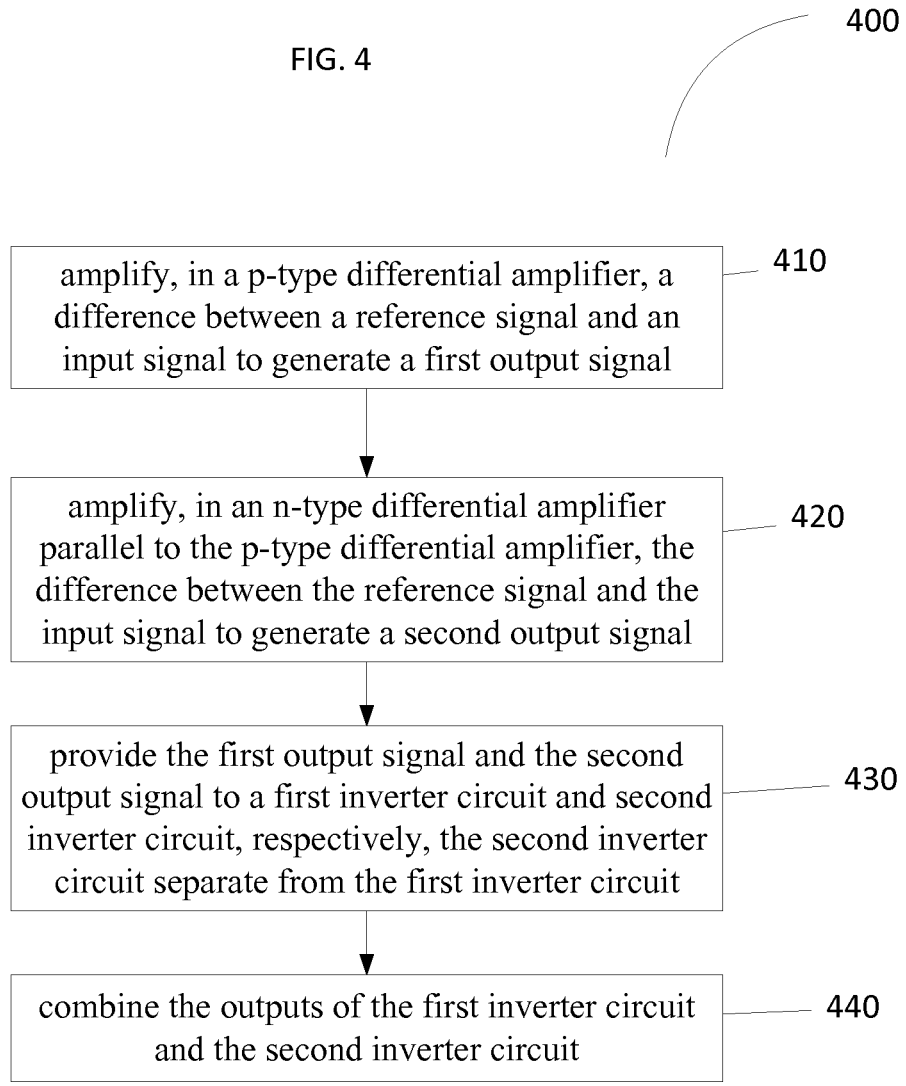
FIG. 4 is a flow diagram of a method according to various embodiments.

FIG. 4 is a flow diagram of a method 400 according to various embodiments. The method 400 may be performed by an input buffer system 100 (FIG. 1) or a mixed mode receiver 200 (FIG. 2), or a switched mixed-mode amplifier 300 (FIG. 3).

In operation 410, a differential amplifier, for example the circuit 110 (FIG. 1), the differential amplifier 210 (FIG. 2) or the differential amplifier 310 (FIG. 3) may amplify a difference between a reference signal and an input signal to generate an output signal. The differential amplifier may be externally biased or the amplifier may be at least partially self-biased.

In operation 420, a second differential amplifier, for example the circuit 112 (FIG. 1), the differential amplifier 212 (FIG. 2) or the differential amplifier 312 (FIG. 3) may amplify the difference between the reference signal and the input signal to generate another output signal. The second differential amplifier may be externally biased or the second differential amplifier may be at least partially self-biased.

The input signal may include an address signal, a data signal, a chip select signal, a clock signal, a clock enable signal to indicate a validity of the clock signal, a row address strobe signal, a column address strobe signal, a write enable signal, or a data-mask signal. The supply voltage Vcc of one or both of the differential amplifiers may be less than one volt.

In operation 430, the differential amplifiers may provide the respective output signals to a first inverter circuit and a second inverter circuit. Inverter circuits 122 and 126 (FIG. 1), or inverter circuits 222 and 226 (FIG. 2) may be operable to serve as the first inverter circuit and the second inverter circuit.

In operation 440, an output circuit, for example the output circuit 136 (FIG. 1) or 236 (FIG. 2), may combine the outputs of the first inverter circuit and the second inverter circuit.

Various embodiments may have more or fewer activities than those shown in FIG. 4. In some embodiments, the activities may be repeated, and/or performed in serial or parallel fashion. Some embodiments may comprise the same activities in a different order.

Figure 5:
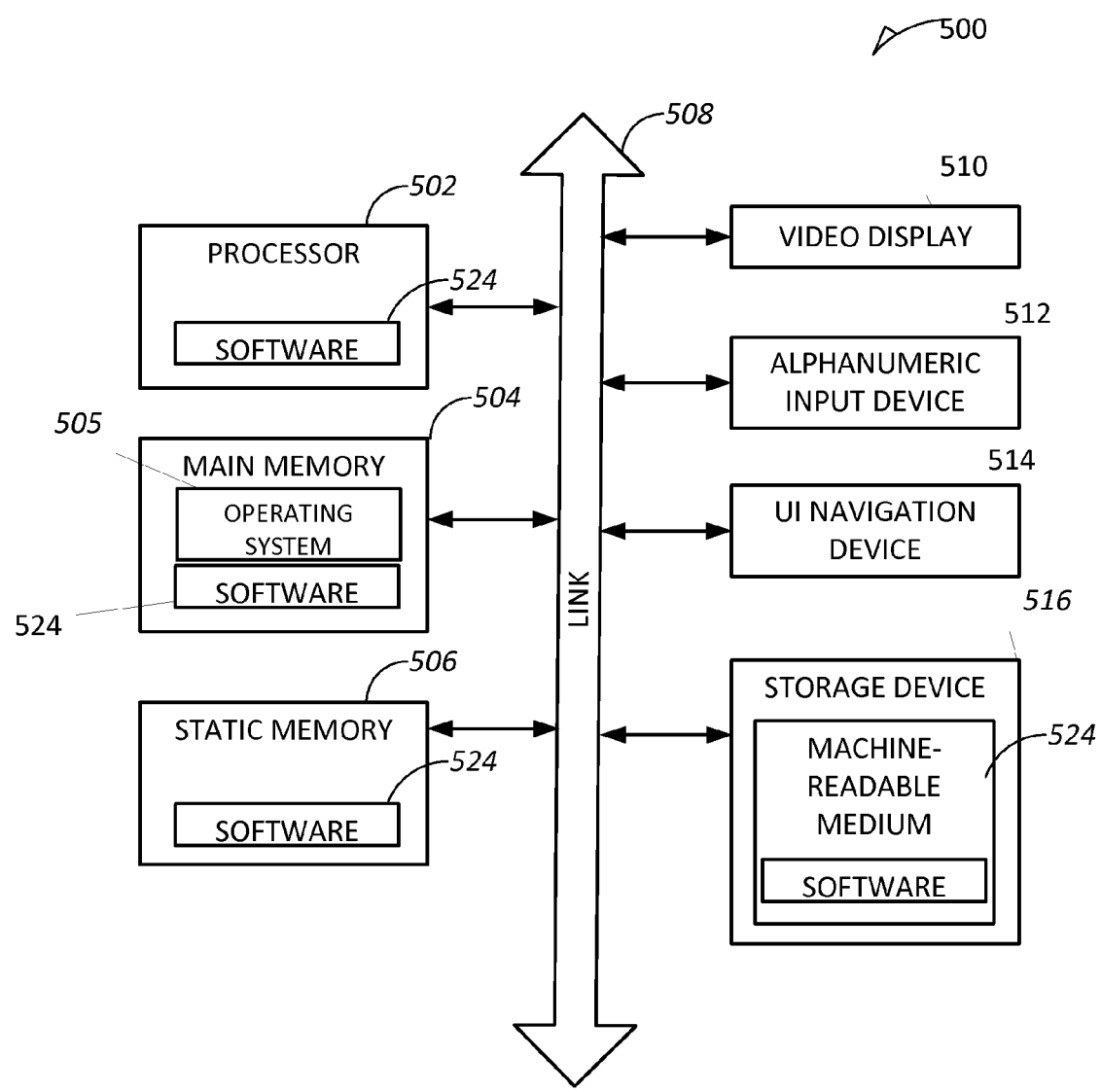
FIG. 5 is a block diagram of an apparatus in the form of a processing system according to various embodiments.

Any integrated circuit that receives an input signal (e.g., an input signal from an external source) may utilize the example embodiments described above with respect to FIG. 1-4. FIG. 5 illustrates an example processing system 500 that may utilize an electronic device comprising an input buffer constructed in accordance with any of the embodiments described above with respect to FIG. 1-4.

The processing system 500 may include a personal computer (PC), a tablet PC, a set-top box (STB), a Personal Digital Assistant (PDA), a mobile telephone, a web appliance, a network router, switch or bridge, an audio/video processor or recorder, a gaming console, a digital television set, a wired or wireless telephone, a navigation device, a digital camera, or any other electronic device.

The processing system 500 may include at least one processor 502 (e.g., a central processing unit (CPU), a graphics processing unit (GPU) or both, processor cores, compute nodes, etc.), main memory 504, and static memory 506, which communicate with each other via link 508 (e.g., bus). The processing system 500 may further include video display unit 510, an alphanumeric input device 512 (e.g., a keyboard), and user interface (UI) navigation device 514 (e.g., a mouse). In an embodiment, video display unit 510, input device 512, and UI navigation device 514 are incorporated into a touch screen display.

Example structures and methods of input buffer systems have been described. Although specific embodiments have been described, it will be evident that various modifications and changes may be made to these embodiments. Accordingly, the specification and drawings are to be regarded in an illustrative rather than a restrictive sense.

The Abstract of the Disclosure is provided to comply with 37 C.F.R. §1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for streamlining the disclosure. This method of disclosure is not to be interpreted as limiting the claims. Thus, the following claims are hereby incorporated into the Detailed Description, with each claim standing on its own as a separate embodiment.

What is claimed is:

1. An apparatus comprising:
    a first circuit to amplify a difference between an input signal and a reference signal;
    a first inverter circuit having a first inverter and a first shunt resistance coupled to the first inverter, the first inverter being configured to receive a first output signal of the first circuit, a first output common mode and a first output swing of the first output signal from the first circuit, wherein the first inverter circuit is configured to adjust the first output common mode and the first output swing of the first output signal by varyin the first shunt resistance of the first inverter circuit;
    a second circuit to amplify the difference between the input signal and the reference signal;
    a second inverter circuit having a second inverter and a second shunt resistance coupled to the second inverter, the second inverter being configured to receive a second output signal of the second circuit, a second output common mode and a second output swing of the second output signal from the second circuit, wherein the second inverter circuit is configured to adjust the second output common mode and the second output swing of the second output signal by varying the second shunt resistance of the second inverter circuit; and
    an output circuit to combine outputs of the first inverter circuit and the second inverter circuit.

2. The apparatus of claim 1, wherein
    the first circuit comprises a p-type differential amplifier; and
    the second circuit comprises an n-type differential amplifier.

3. The apparatus of claim 2, wherein at least one of the p-type differential amplifier and the n-type differential amplifier is configured to be at least partially self-biased.

4. The apparatus of claim 2, wherein at least one of the p-type differential amplifier and the n-type differential amplifier is configured to be externally biased.

5. The apparatus of claim 1, wherein the shunt resistance has a resistance value between 1 ohm and 50 kilo-ohms.

6. The apparatus of claim 5, wherein the shunt resistance comprises a transistor.

7. The apparatus of claim 5, wherein the shunt resistance comprises a resistor.

8. The apparatus of claim 1, wherein the output circuit comprises an inverter.

9. A method comprising:
    amplifying, at a first differential amplifier, a difference between a reference signal and an input signal to generate a first output signal;
    amplifying, at a second differential amplifier, the difference between the reference signal and the input signal to generate a second output signal;
    providing the first output signal of the first differential amplifier, a first output common mode and a first output swing of the first output signal from the first differential amplifier to a first inverter circuit, the first inverter circuit having a first inverter and a first shunt resistance coupled to the first inverter, and the first inverter circuit being configured to adjust the first output common mode and the first output swing of the first output signal by varying the first shunt resistance of the first inverter circuit;
    providing the second output signal of the second differential amplifier, a second output common mode and a second output swing of the second output signal from the second differential amplifier to a second inverter circuit, the second inverter circuit having a second inverter and a second shunt resistance coupled to the second inverter, and the second inverter circuit being configured to adjust the second output common mode and the second output swing of the second output signal by varying the second shunt resistance of the second inverter circuit; and
    combining outputs of the first inverter circuit and the second inverter circuit.

10. The method of claim 9, wherein the first differential amplifier includes a p-type differential amplifier, and the second differential amplifier includes an n-type differential amplifier.

11. The method of claim 9, wherein the input signal has a magnitude of less than one volt.

12. The method of claim 9, wherein the input signal is one of
    an address signal;
    a data signal;
    a chip select signal;
    a clock signal;
    a clock enable signal to indicate a validity of the clock signal;
    a row address strobe signal;
    a column address strobe signal;
    a write enable signal; and
    a data-mask signal.

13. The method of claim 9, further comprising:
    at least partially self-biasing at least one of first differential amplifier and the second differential amplifier.

14. The method of claim 13, further comprising:
    providing external biasing to at least one of the first differential amplifier and the second differential amplifier.

15. An apparatus comprising:
    a Current Mode Logic (CML) input buffer including
        a first differential amplifier to amplify a difference between an input signal and a reference signal, and
        a second differential amplifier to amplify the difference between the input signal and the reference signal;
    a third differential amplifier to receive an output of the first differential amplifier;
    a fourth differential amplifier to receive an output of the second differential amplifier;
    a first inverter circuit having a first inverter and a first shunt resistance coupled to the first inverter, the first inverter being configured to receive a first output signal of the third differential amplifier, a first output common mode and a first output swing of the first output signal from the third differential amplifier, wherein the first inverter circuit is configured to adjust the first output common mode and the first output swing of the first output signal by varying the first shunt resistance of the first inverter circuit;

a second inverter circuit having a second inverter and a second shunt resistance coupled to the second inverter, the second inverter being configured to receive a second input signal of the fourth differential amplifier, a second output common mode and a second output swing of the second output signal from the fourth differential amplifier, wherein the second inverter circuit is configured to adjust the second output common mode and the second output swing of the second output signal by varying the second shunt resistance of the second inverter circuit; and an output circuit to combine an output of the first inverter circuit with an output of the second inverter circuit.

16. The apparatus of claim 15, wherein
the first differential amplifier is an n-type differential amplifier,
the second differential amplifier is a p-type differential amplifier,
the third differential amplifier is an n-type differential amplifier, and
the fourth differential amplifier is a p-type differential amplifier.

17. The apparatus of claim 15, further comprising a switch to disconnect the output of the first inverter circuit or the second inverter circuit from an output signal.

18. The apparatus of claim 15, wherein at least one of the third differential amplifier and the fourth differential amplifier is at least partially self-biased.

19. The apparatus of claim 15, wherein at least one of the third differential amplifier and the fourth differential amplifier is externally biased.

20. The apparatus of claim 15, wherein the first inverter circuit comprises:
an inverter; and
a resistance coupled to the inverter, the resistance having a value between 1 ohm and 50 kilo-ohms.

21. The apparatus of claim 20, wherein a first end of the resistance is coupled to an input of the inverter and a second end of the resistance is coupled to an output of the inverter.

* * * * *